United States Patent

Devore et al.

[15] 3,643,135

[45] Feb. 15, 1972

[54] TRIAXIALLY EXPANDABLE CIRCUIT ARRAYS

[72] Inventors: Ernest W. Devore; Kenneth L. Hotaling, both of Boulder, Colo.

[73] Assignee: International Business Machines Corporation, Armonk, N.Y.

[22] Filed: June 29, 1970

[21] Appl. No.: 50,649

[52] U.S. Cl. ........................................................317/101 D

[51] Int. Cl. ........................................................H02b 1/02

[58] Field of Search .............339/17 LM, 17 C, 17 LC, 17 N, 339/17 FP, 176 MP; 317/101 D, 101 DH, 101 CC, 101 A; 35/19 A

[56] References Cited

UNITED STATES PATENTS

| | | | |
|---|---|---|---|
| 3,005,131 | 10/1961 | Melcher et al. | 317/101 D |
| 3,340,439 | 9/1967 | Henschen et al | 317/101 D |
| 3,212,047 | 10/1965 | McDonough | 317/101 D |
| 2,967,267 | 1/1961 | Steinman et al. | 317/101 D |
| 3,239,719 | 3/1966 | Shower | 317/101 A |
| 3,234,433 | 2/1966 | Braunagel | 317/101 D |
| Re 26,837 | 4/1970 | Evans | 317/101 D |
| 3,237,341 | 3/1966 | Janning | 35/19 A |
| 3,495,134 | 2/1970 | Collins et al. | 317/101 D |

*Primary Examiner*—David Smith, Jr.

*Attorney*—Hanifin and Jancin and Herbert F. Somermeyer

[57] ABSTRACT

An electronic circuit module and resulting array, each module having an insulating support body with first, second and third electrical conductive means extending through the body along three mutually perpendicular axes. The plugs and receptacles of the respective conductive means are arranged to provide orientation of the module such that when a plurality of modules are connected together, appropriate circuit connections are made. A recess in each of the modules provides vertical cooling chimneys in the array. The array may be arranged such that one module in each of the cooling chimneys is activated at a given time to minimize the heat accumulation. The triaxially extending electrical conductive means also carries heat toward the array surface to further limit temperature rise within the array.

11 Claims, 5 Drawing Figures

INVENTORS

ERNEST W. DEVORE

KENNETH L. HOTALING

BY

ATTORNEY

TRIAXIALLY EXPANDABLE CIRCUIT ARRAYS

BACKGROUND OF THE INVENTION

This invention relates to modular electronic packaging and particularly to an electronic package capable of forming an array of such packages in a triaxially expandable manner.

Presently, interconnection of dense repetitive electronic circuits having common input, output and control connections present severe wireability, expansion, modification and serviceability problems. Many packaging techniques have been implemented that are uniaxially expandable, that is, can be expanded along one axis. Other packaging schemes have been devised which are supposedly expandable in one plane, i.e., along two axes. In the latter situation, most circuit connections go to a common interconnection board, which increases the length of electrical circuit leads. As higher frequencies are encountered and more sensitive circuits are utilized, the lead lengths between component parts limit the ability of an electronic system to rapidly perform desired functions.

Accordingly, it is desired to have a compact electronic package which is modular to a maximum degree and provides minimum wiring lengths, minimum physical size while simultaneously maximizing serviceability and modification. For low cost, it is desired that all the circuit modules be substantially identically constructed.

In compact or dense electronic arrays, heat generation within the center of the array can be a severe problem. Provisions should be made in the basic building block or module for facilitating heat transfer from the center of the array. Also external interconnections to the array should be easy and flexible, yet provide expandability and easily accessible test points.

SUMMARY OF THE INVENTION

It is an object of the present invention to provide a facile triaxially expandable electronic package and resulting array.

An electronic circuit module constructed in accordance with the teachings of the present invention includes an insulating support body of a general rectangular configuration having a plurality of surfaces respectively extending transfers to three mutually perpendicular axes. Further, first, second and third electrical conductive means extend through the body along said respective axes. Each conductive means includes a plug at one end and a receptacle at the other end such that the modules can be plugged together along any of the three axes. Other electrical interconnections may be used while still maintaining triaxial expandability.

Another feature of the invention includes a circuit module having a recess which is vertically oriented when disposed in a rectangular array of such modules. The recesses of the various modules in a vertical column form a cooling chimney such that the inner portion of the array is cooled by airflow through the chimney in addition to heat being conducted along the various conductive means. The array may be organized such that only one horizontal plane of modules is actuated at a given time such that one and only one module along each cooling chimney is producing heat.

Orientation of a circuit module is provided by two conductive means lying along a common plane being offset with respect to the surfaces perpendicular to such plane. The plugs of the two conductive means in such plane extend from the module adjacent one corner thereof. The corresponding receptacles are recessed into the body opposite the plugs. Conductive means along the third axis perpendicular to the plane are integral plug-receptacles. The latter receptacle may be in insulating legs of the body.

The two conductive means disposed along the plane may consist of separate plugs and receptacles which are electrically interconnected by a layered circuit means. Additionally, an electrical circuit supported by the layered circuit means selectively makes electrical connections between the various conductor means for performing a spatial electrical function.

The foregoing and other objects, features, and advantages of the invention will be apparent from the following more particular description of preferred embodiments of the invention, as illustrated in the accompanying drawings.

DETAILED DESCRIPTION OF A PREFERRED EMBODIMENT

The Circuit Module

Figure 1:
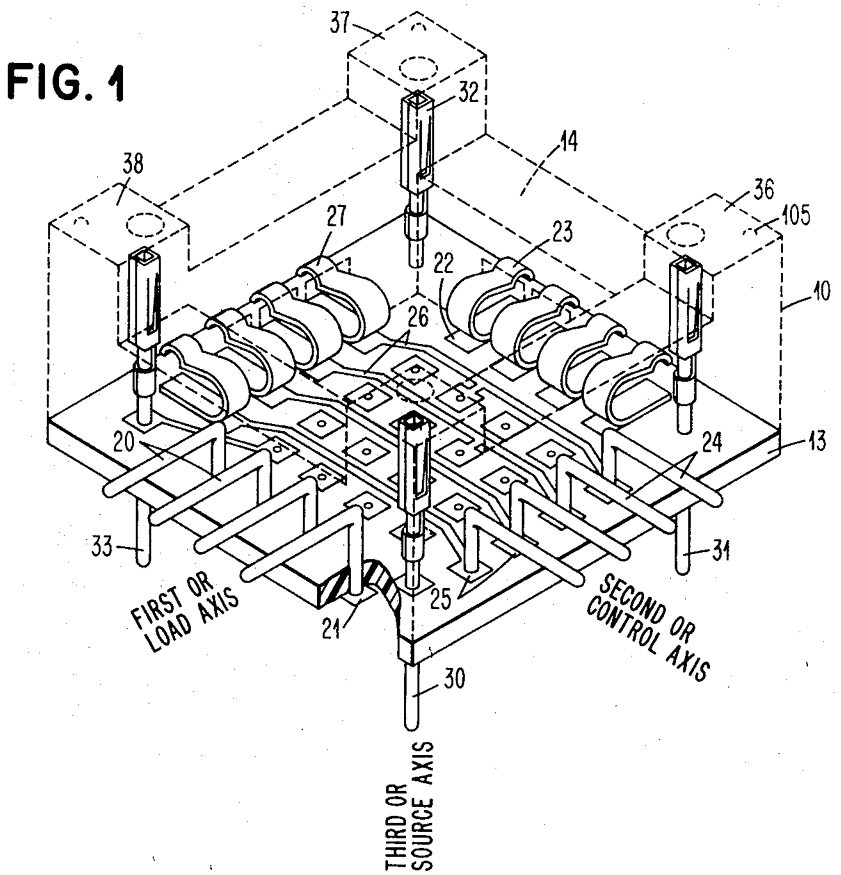
FIG. 1 is a simplified diagrammatic and perspective view of a circuit module constructed according to the teaching of the present invention with the body thereof being shown as transparent for better illustrating parts with the module.
Figure 3:
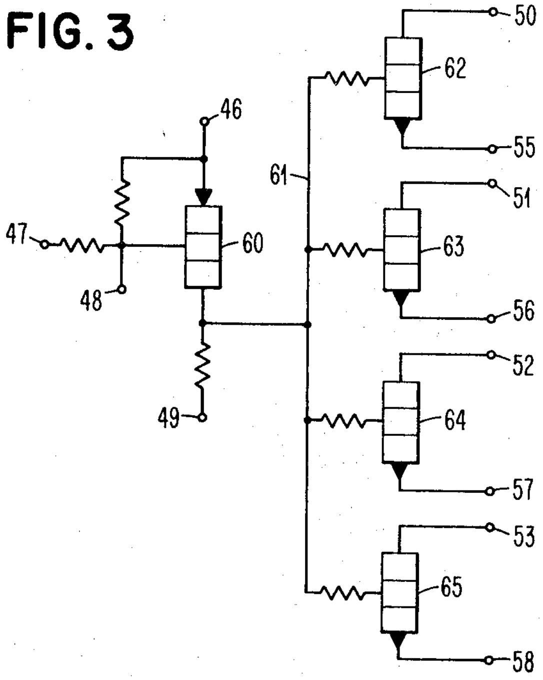
FIG. 3 is a simplified circuit diagram illustrating a circuit usable with the circuit means of the FIG. 1 illustrated module.
Figure 2:
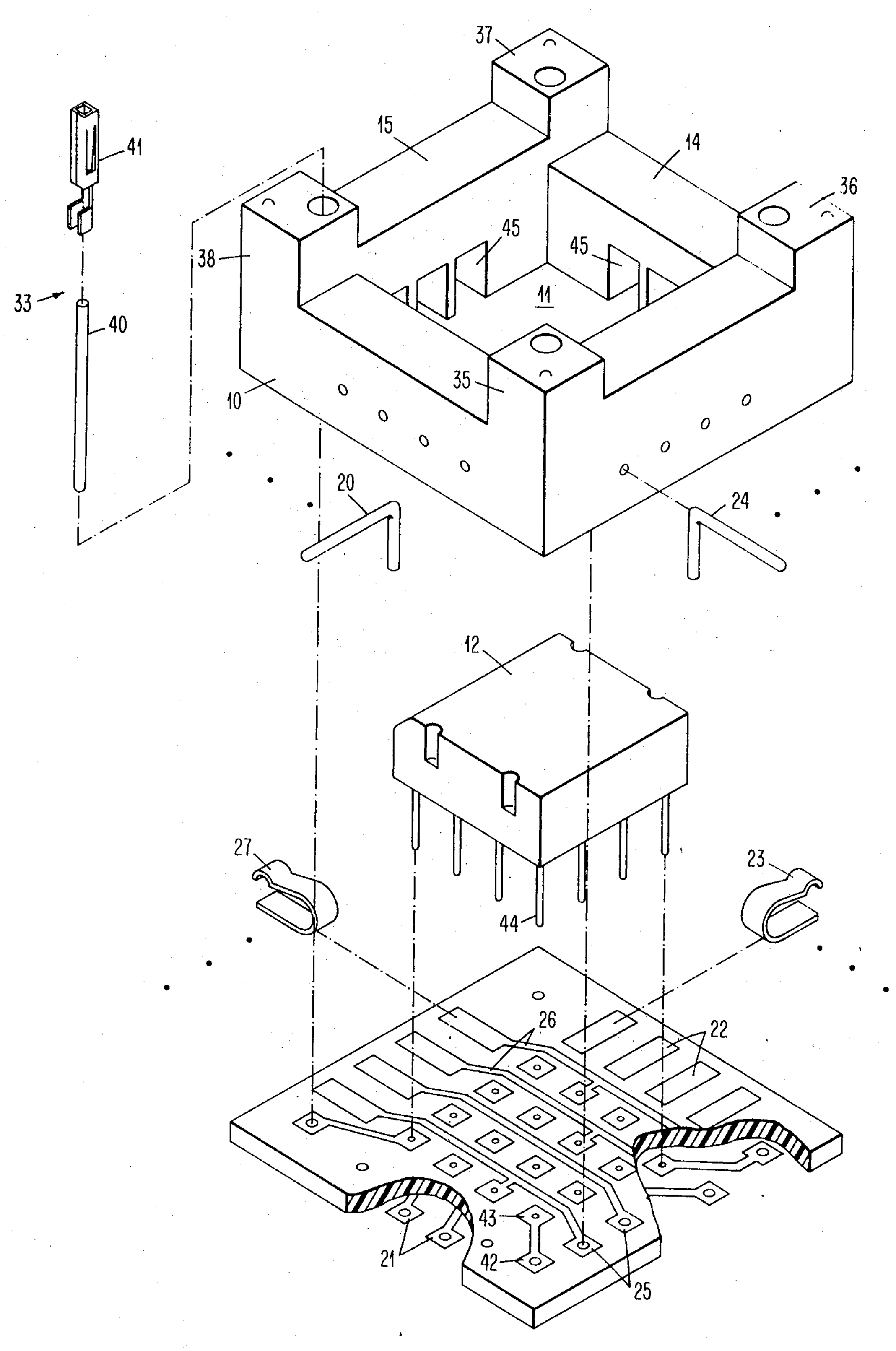
FIG. 2 is a simplified view of the module shown in FIG. 1 exploded along the third axis. Repetitive parts are shown only once.

With more particular reference now to FIGS. 1–3, a circuit module constructed according to the present invention is described in detail. In a later section, an array constructed by assembling a plurality of such modules is described in detail. Like numbers indicate like parts and structural features in the various views and diagrams.

A generally rectangular module has a plurality of surfaces extending transverse to the first, second and third axes, which are mutually perpendicular. As best seen in FIG. 2, insulating body 10 of the module has central opening 11 for receiving circuit assembly 12 (FIG. 2). The insulating body is a rectangular toroid with four upstanding legs at the respective corners of the toroid. Layered circuit means 13 is firmly attached to the underside of body 10 and also supports circuit assembly 12. As such, layered circuit board 13 forms the under surface of the circuit module. In FIG. 1, circuit assembly 12 is not shown for better illustrating the other parts of the module.

A first recess 14 extends through body 10 along the first axis. This recess in combination with the other modules forms a cooling chimney in the ultimate array. Accordingly, preferred that the first axit be oriented vertically. Second recess 15 extends through body 10 along the second axis. This recess is designed to receive on array holding bar, as described later.

A first conductive means extends along the first axis. In the first means four outwardly extending L-shaped plugs 20 make electrical connection to layered conductors 21 disposed on the outer surface of board 13. These four layered conductors extend across board 13 and are connected to land conductive areas 22 by feed through connections (not shown). Resilient receptacles 23 are secured to areas 22, as by soldering or brazing.

In a similar manner, second conductive means extend across the module along the second axis. Four L-shaped pins or plugs 24 extend outwardly of body 10 along the second axis. Electrical contact is made to the circuitry on board 13 in conductive land areas 25. Layered conductors 26 extend across the upper side of board 13 to make electrical connections with resilient receptacles 27. Each of the plugs 20, 24 is respectively directly electrically connected to the opposing receptacles 23 and 27. Circuit assembly 12 is connected to the first and second conductive means via the land areas on board 13. Signals received along the second or control axis are used to actuate circuit assembly 12 for selectively connecting conductors in the first (load) conductor means axis to conductors in the third (source) conductive means.

In a similar manner, conductive means along the third axis consists of four unitary plug-receptacles 30–33. Each plug-receptacle extends from the lower side of board 13 through the upstanding legs 35–38 respectively with a receptacle opening at the top of the respective legs. Each plug-receptacle may consist of two parts; a receptacle portion 41 crimped onto pin portion 40 (FIG. 2). The pin portions 40 of the various plug-receptacles are soldered to conductive land areas on the underside of board 13 for making electrical connections between the third axis and circuit assembly 12. For example, as shown in FIG. 2 land area 42 is connected to plug-receptacle 30 and is electrically connected to land area 43. Pin 44 of circuit package 12 makes electrical connection with land area 43. The other four plug receptacles 31–33 are similarly connected to the other corner pins of circuit package 12.

Figure 4:
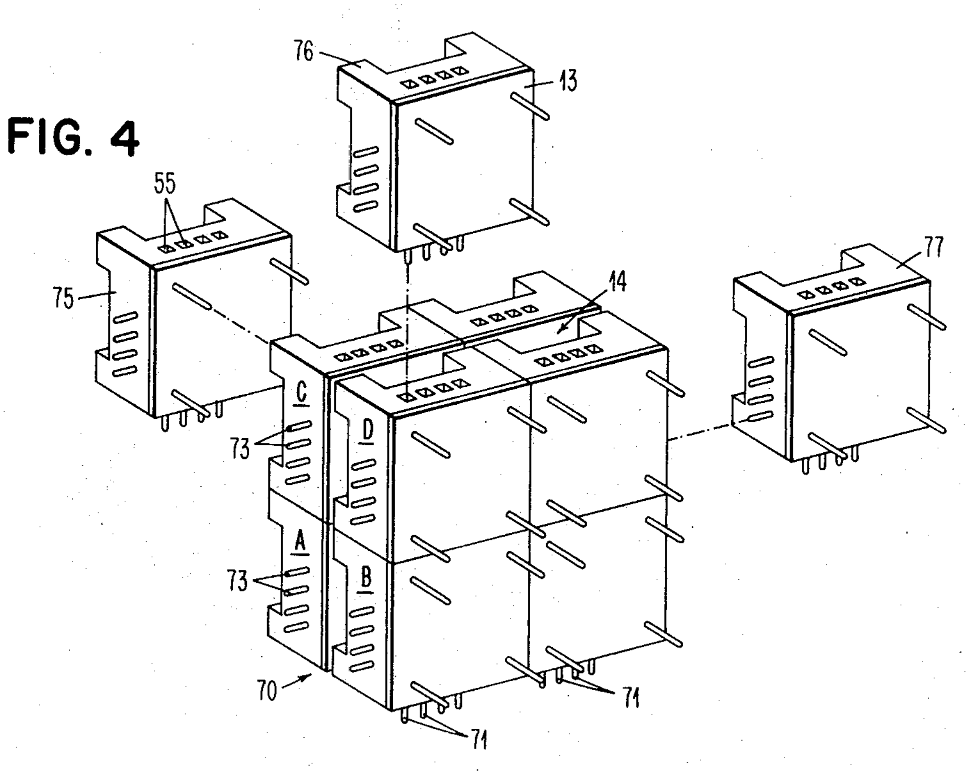
FIG. 4 is an abbreviated diagrammatic showing of an array constructed in accordance with the present invention and arranged to show the triaxial expandability thereof.

As best seen in FIG. 2, receptacles 23, 27 each nest into grooves 45 of body 10. An aperture is disposed in body 10 for each groove to receive a pin from a connector plug or another module. Such apertures 55 are best seen in FIG. 4. Alternately, the grooves could open outwardly of body 10.

While the electrical interconnections have been illustrated as consisting of plug-receptacle pairs, no limitation thereto is intended. Leaf spring types of interconnections could be used. Of course, other forms of plug-receptacles may also be selected.

The illustrated circuit module is of particular interest for crossbar-type switching applications. That is, a control signal received along one axis is used to selectively interconnect electrical conductors extending along two other axes. A simplified circuit for accomplishing a crossbar switching operation is shown FIG. 3. The FIG. 3 terminals each correspond to a depending pin of circuit package 12 for connection to conductive land areas on board 13 the second or control axis connections are as follows: Terminal 46 receives a +6-volt collector-emitter supply voltage. Terminal 49 receives ground reference potential. Terminals 47 and 48 receive control signals. In a similar manner, the conductive means along the first axis is connected to the output terminals 50–53, while the conductive means along the third axis are connected to the source terminals 55–58. The operation of the circuit is that of a switch. When control transistor 60 is current conductive, a relatively positive switch-actuating voltage is supplied over control line 61 to each of the crossbar line connecting transistor switches 62–65. These transistors become current conductive to electrically connect their respective conductors along the third axis to the conductors disposed along the first axis. With transistor 60 nonconductive, the switches are open. As shown, four independent electrical connections are switched within a single circuit module. Other electrical functions which perform logic operations may be selected.

The Triaxially Expandable Modular Circuit Array

To grasp a good understanding of the expandability and modularity of the array, reference is first directed to FIG. 4. A small 2×2×2 array 70 is shown. The first or load axis is disposed vertically such that vertical cooling chimneys are formed between printed circuit boards 13 and the facing recesses 14 of the various modules. Electrical connections to the vertical conductive means are through the depending plugs 71 on the bottom horizontal plane of circuit modules. The receptacles opening upwardly of the array 70 are used for test points on the output or load axis conductors.

The third or source axis is connected to external circuitry by outwardly extending plugs 72. It may be noted at this point that the plug-receptacles disposed along the third axis present the least ohmic resistance of any of the conductive means. This provides for circuit efficiency in distributing source signals throughout the array. Incidentally, this may be the longest axis of the array, i.e., maximum number of circuit modules may be expected to reside along the third axis. To minimize array size the module dimension along the third axis is kept small.

The first or control axis is disposed horizontally and has external electrical connections via outwardly extending plugs 73. The outwardly opening receptacles opposite the plugs 72 and 73 respectively in the first and third axes are also used as test points. Accordingly, every circuit conductor within the array is easily accessible from the upper of side surfaces for testing.

To expand array 70 along any axis, it is preferred that additional circuit modules, such as modules 75, 76 or 77 be plugged into the receptacles which were used for test points. When electrical connections to the array are made via plugs 71, 72 and 73, expanding the array in the opposite direction permits the electrical connections to remain unchanged. To replace a defective part, an additional plane of modules may be added along any two axes and the electrical connections appropriately changed. The defective module may be left within the array. Such flexibility reduces maintenance costs. If the receptacles were used to make external electrical connections, expansion should be from plugs 71, 72, 73.

Examination of FIG. 4 shows that if only one circuit module in each vertical column of modules is actuated at a given time, only one circuit module contributes heat to the respective cooling chimneys. Accordingly, only one horizontal row in each planar array of modules is actuated at a given time. That is, in the FIG. 5 2×2 array, two horizontal rows of modules in mutually exclusive planar arrays may be simultaneously actuated. Rows A and D or B and C may be simultaneously actuated since they have no common connection along either the first or third axis. Rows A and B or rows C and D cannot be simultaneously actuated because of the common connections along the third or source axis. Similarly, Rows A and C or B and D cannot be simultaneously actuated because of the common connections along the first axis. It is remembered from FIG. 3 that along the control axis not only control signals but also the power supply voltages are distributed.

Figure 5:
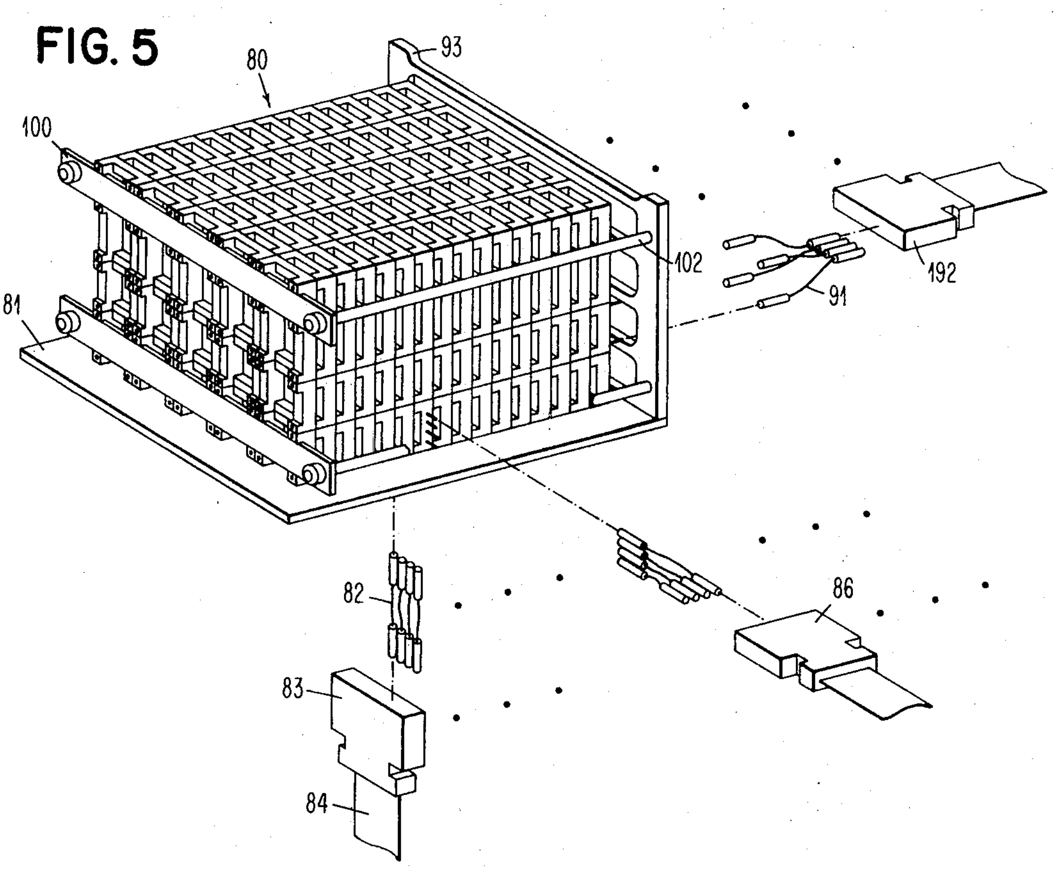
FIG. 5 is a simplified diagrammatic showing of electrical interconnections between a triaxially expandable array in accordance with the present invention and other electrical circuits (not shown).

Referring now to FIG. 5, a constructed embodiment of the present invention is shown in simplified diagrammatic form. The triaxially expandable array 80 of circuit modules is supported on chassis 81. Chassis 81 receives plugs 71 (see FIG. 4; not shown in FIG. 5) of the load axis conductor means. The extent of the expandable array 80 is arbitrarily limited by the physical size of chassis 81. Depending plugs 71 from array 80 are inserted into modular receptacle array 83 via plug wires 82. A plurality of ribbon cables 84 extend from receptacles 83. Cables 84 are connected to electrical devices (not shown) designed to supply the signals along the third or source axis.

Electrical connections to the second or control axis are made via a plurality of receptacles 86 similarly attached to ends of ribbon cables. Only one is shown for simplicity. Receptacles 86 are supported in any arbitrary manner. Connection wires 87 connect receptacles 86 to array 80.

In a similar manner, the array wires 91 extending along the third axis are plugged into ribbon-cable terminating receptacles 92 each terminating a ribbon cable.

Alternately, of course, other types of electrical connections may be made.

In one practical application of array 80, a peripheral device control unit supplied signals to the array along the third or source axis and simultaneously supplied select or control signals to the conductive means extending along the second or source axis. A plurality of peripheral devices such as magnetic tape units (not shown) were connected to the load axis. By connecting a plurality of control units along the source axis and a plurality of tape units along the load axis, any one of the control units can be selectively switched to any one of the tape units for exchanging signals therebetween.

Horizontal holding bars 100 extend across the end of array 80 and are secured to support plate 101 by a plurality of rods 102. By compressing the array, good electrical connections along the third or source axis are ensured. Bars 100 extend through recesses 15 of the various circuit modules. In array 80, all of the outwardly opening receptacles are easily accessible from the top side of from two of the sides.

Array circuit board 13 is forced directly against the upper faces of upstanding legs 35, 36, 37, 38 of the various circuit modules. Upstanding dimples 105 (FIG. 1) on each of the legs provide spacing between the circuit modules. Such spacing allows for solder buildup on circuit boards 13 and thereby maintains true modularity along the third axis. That is, regardless of solder buildup difference between modules, the space along the third axis for each plane of modules is the same. This arrangement also ensures each plane of modules is uniform thereby ensuring good electrical connections.

In a compact array, crosstalk between the parallel conductive means and between circuits within the various modules is an important design consideration. Such consideration becomes increasingly important at higher operating frequencies.

The layered conductors on circuit boards 13 which carry DC potentials (including ground) provide effective ground planes disposed along the first and second axes. If desired, additional conductive means electrically connected to a reference potential may be added as necessary. Along this third axis, extra conductive means may be added between the four corners of each module 10. There may also be connected to a reference potential to reduce electrical crosstalk along the third axis. Also, the module size may be increased to provide more design choices for creating reference potential planes throughout the array. Of course, larger modules would also increase circuit choices within the array as well as reducing the number of serial connections along selected axes.

In this regard, modules may have any lengths along any axis and still practice the disclosed inventive concepts. When the external electrical connections are made via shielded or coaxial cables, ground reference conductive means provide convenient tie points for such cable shields.

By adding planes of modules along any one of the three axes, defective modules may be replaced without disassembling the array. All that need be accomplished is moving all external connections to the newly added plane of modules. Also, functions may be added in the same manner. In this case, additional external connections would be accommodated. Therefore, serviceability, maintainability, and expandability of any array of electrical circuits may be enhanced by using the present invention.

While the invention has been particularly shown and described with reference to preferred embodiments thereof, it will be understood by those skilled in the art that various changes in form and details may be made therein without departing from the spirit and scope of the invention.

What is claimed is:

1. An electronic circuit module, including the combination,
- insulating support body means having a general rectangular configuration with a plurality of surfaces respectively extending transverse to three mutually perpendicular axes,
- first independent conductive means extending through said body means generally along a first of said axes,
- second independent conductive means extending through said body means generally along a second of said axes,
- third independent conductive means extending through said body means generally along a third of said axes,
- electrical circuit means having electrical connections to each said conductive means and being responsive to a predetermined electrical signal on one conductive means to perform an electrical circuit function having an electrical effect on another conductive means, and
- each conductive means including pairs of separate electrical interconnection means for electrical connection to conductive means in any adjacent module in either direction along each of the respective three axes.

2. The module set forth in claim 1, wherein said body means includes layered circuit means in a plane parallel to said first and second axes and forming one surface thereof, said conductive means along said first conductors in said layered circuit means extending respectively between said interconnection means thereof, and said third conductive means providing an electrical connection through said body means independent of said layered circuit means and including electrical connections thereof, and said electrical circuit means being on said layered circuit means and including connections to each of said first and second conductive means only on said layered circuit means. only on said layered circuit means.

3. The module set forth in claim 2 wherein said interconnection means for said third conductive means includes a plurality of spaced-apart integral plug-receptacles extending through said body means parallel to said third axis.

4. An electronic circuit module, including the combination:
- insulating body support means having a general rectangular configuration with a plurality of surfaces respectively extending transverse to three mutually perpendicular axes,
- first, second, and third independent conductive means respectively extending through said body means generally along said first, second, and third mutually perpendicular axes,
- circuit means in the module being connected to each of said independent conductive means, each independent conductive means including pairs of separate electrical interconnection means for electrical connection to independent conductive means in any adjacent module in either direction along each of the respective three axes,
- said body having a thickness along said third axis substantially less than along said first and second axes,
- said body means having a recess extending along each said first and second axes opposite said circuit means such that four upstanding legs are located at corners of said body means extending parallel to said third axes and one of said plug-receptacles being disposed in each said legs, each with electrical connections to said circuit means.

5. The module set forth in claim 4 wherein said interconnection means for first and second conductive means each include a given plurality of spaced-apart separate plugs extending outwardly of said body means respectively along said first and second axes and each plug having a separate electrical connection to said circuit means,
- a given plurality of separate receptacles in each said first and second conductive means disposed along the respective axes opposite to said plug means and having separate electrical connections to said circuit means, and
- both said first and second conductive means being disposed in said body means closer to one of said corner legs than any other leg.

6. The module set forth in claim 5 wherein said plugs of said first and second conductive means extend outwardly of said body means adjacent said one leg opposite thereto.

7. The module set forth in claim 1 wherein said body means is a rectangular toroid having said third axis as the toroidal axis,
- four upstanding legs respectively at the corners of said toroid extending outwardly along said third axis,
- said third conductive means including a plug-receptacle unit disposed in each of said legs and extending therethrough with plug portions thereof extending outwardly from said respective legs and receptacle portions thereof outwardly opening along said third axis,
- said circuit means being disposed within said toroid, and
- a layered circuit board mounting said circuit means and closing said toroid opposite to said upstanding legs and being substantially coextensive with said toroid along said first and second axes and having layered circuit conductors in electrical connection thereto.

8. The module set forth in claim 7 wherein said first and second conductive means each include a plug extending outwardly from first and second module surfaces respectively along said first and second axes and an outwardly extending receptacle on a surface opposite to first and second surfaces,
- said toroid having a plurality of inwardly opening recesses for respectively receiving said first and second conductive means, and said layered circuit board mounting said receptacles in said first and second conductive means and being secured to said toroid for supporting said receptacles.

9. The module set forth in claim 8 having a circuit assembly mounted on said circuit board and extending into said toroid and said circuit board providing electrical connections between said circuit assembly and said conductive means such that signals received on one of said conductive means actuate said circuit assembly to selectively provide an electrical circuit connection between other of said conductive means.

10. An array of physically identical generally rectangular electrical circuit modules, each module having independent feedthrough electrical conductive means extending along three mutually transverse axes, each conductive means having mated electrical interconnection means, each module having electrical circuit means connected to each conductive means in an identical manner, said array being changeable in size along any three or all of said axes by adding or removing such modules to and from the array.

11. The array set forth in claim 10 wherein all said interconnection means including mated plugs and receptacles, said plugs in each module extending along the respective axes extend in a like direction from the respective modules, peripheral rows of said modules forming six sides of said array with only receptacles opening outwardly of said array from three of said array sides and only plugs extending from another three of said array sides, external electrical connections to said plugs, extending from said array and no permanent electrical connection to said receptacles opening outwardly of said array to thereby provide access to every electrical circuit within said array without disassembly thereof.

* * * * *

930-4008-00D
PO-1050
(5/69)

UNITED STATES PATENT OFFICE
CERTIFICATE OF CORRECTION

Patent No. 3,643,135 Dated February 15, 1972

Inventor(s) Ernest W. Devore and Kenneth L. Hotaling

It is certified that error appears in the above-identified patent and that said Letters Patent are hereby corrected as shown below:

Column 5, line 73, after "first" insert --and second axes including layered--.

Column 6, line 3, "thereof" should read --thereto--.

Column 6, line 6, after "." (first occurrence) delete --only on said layered circuit means.--.

Signed and sealed this 20th day of June 1972.

(SEAL)
Attest:

EDWARD M.FLETCHER,JR.
Attesting Officer

ROBERT GOTTSCHALK
Commissioner of Patents